United States Patent
Kim et al.

(10) Patent No.: US 11,337,342 B2
(45) Date of Patent: May 17, 2022

(54) DISPLAY DEVICE

(71) Applicant: LG ELECTRONICS INC., Seoul (KR)

(72) Inventors: Jongwon Kim, Seoul (KR); Yeojun Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/217,972

(22) Filed: Mar. 30, 2021

(65) Prior Publication Data

US 2022/0095479 A1 Mar. 24, 2022

(30) Foreign Application Priority Data

Sep. 21, 2020 (KR) .......................... 10-2020-0121540

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *H01L 51/52* | (2006.01) |

(52) U.S. Cl.
CPC .......... *H05K 7/2099* (2013.01); *H01L 51/529* (2013.01)

(58) Field of Classification Search
CPC ........... H05K 7/20954; H05K 7/20963; H05K 7/20972; H05K 7/20981; H05K 7/2099; H01L 51/529
See application file for complete search history.

(56) References Cited

U.S. PATENT DOCUMENTS

| | | | |
|---|---|---|---|
| 9,665,140 B2 * | 5/2017 | Yang | H05K 7/20154 |
| 2009/0073654 A1 * | 3/2009 | Beam | H05K 7/20418 361/696 |
| 2010/0073864 A1 * | 3/2010 | Hwang | H01L 23/3737 361/679.47 |
| 2011/0051369 A1 * | 3/2011 | Takahara | H05K 7/2099 361/696 |

(Continued)

FOREIGN PATENT DOCUMENTS

| | | |
|---|---|---|
| JP | 2006011638 | 1/2006 |
| KR | 1020150091905 | 8/2015 |
| KR | 1020150127473 | 11/2015 |

OTHER PUBLICATIONS

Korean Intellectual Property Office Application Serial No. 10-2020-0121540, Office Action dated Dec. 14, 2021, 4 pages.

*Primary Examiner* — Anthony M Haughton
(74) *Attorney, Agent, or Firm* — Lee Hong Degerman Kang & Waimey

(57) ABSTRACT

A display device is disclosed. The display device includes a display panel, a frame positioned behind the display panel, a PCB coupled to the frame and including a heating element, and a vapor chamber including an internal space for fluid to flow, wherein the vapor chamber includes a heat-absorbing part in contact with the heating element, a heat-releasing part positioned above the heat-absorbing part and spaced apart from the PCB, and a plurality of lines formed at an outer side of the vapor chamber, wherein the plurality of lines extend in a first direction corresponding to an axis that connects a center of the heat-absorbing part to a center of the heat-releasing part.

15 Claims, 18 Drawing Sheets

(56) References Cited

U.S. PATENT DOCUMENTS

2014/0092554 A1* 4/2014 Yamaguchi ........ H05K 7/20172
                                                                        361/692
2020/0100401 A1* 3/2020 Chang ................ H05K 7/20336
2021/0152793 A1* 5/2021 Usami ................ H05K 7/20972
2021/0173456 A1* 6/2021 Kulkarni ............ H05K 7/20145
2021/0337700 A1* 10/2021 Jung ................... F28D 15/0275

* cited by examiner

DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2020-0121540, filed on Sep. 21, 2020, the contents of which are all hereby incorporated by reference herein in its entirety.

BACKGROUND OF THE INVENTION

1. Field of the Invention

The present disclosure relates to a display device.

2. Description of the Related Art

With the development of information society, demand for various kinds of display devices is increasing. In response to this demand, various kinds of display devices, such as LCDs (Liquid Crystal Display Devices), PDPs (Plasma Display Panels), ELDs (Electro luminescent Displays), VFDs (Vacuum Fluorescent Displays) and OLEDs (Organic Light-Emitting Diodes) have been recently researched and used.

Among these, an LCD panel includes a TFT substrate and a color substrate, which face each other with a liquid crystal layer interposed therebetween, in order to display an image using light supplied from a backlight unit. Meanwhile, an OLED panel is configured to display an image by depositing a self-luminescent organic layer on a substrate having a transparent electrode formed thereon.

In an ultra-thin display device having a large screen, research on a structure capable of efficiently removing heat generated due to display of a high-definition image on the screen has been intensively conducted.

For example, a vapor chamber, which is applied to a display device so as to release heat, may be used in order to release the heat from a heating element, mounted in the display device, to the outside. Therefore, it is possible to reduce thermal damage not only to the heating element but also to elements that are positioned near the heating element due to spatial restrictions in the display device.

SUMMARY OF THE INVENTION

Therefore, the present disclosure has been made in view of the above problems, and it is an object of the present disclosure to provide a display device including a vapor chamber, which has a relatively small volume and which is capable of efficiently releasing the heat from a heating element to the outside.

Another object of the present disclosure is to provide a display device in which a plurality of lines are formed at the outer surface of the vapor chamber in order to improve the heat-releasing capability of the vapor chamber.

Still another object of the present disclosure is to provide a display device in which a plurality of lines are formed at the outer surface of the vapor chamber according to the direction in which the fluid contained in the vapor chamber flows in order to further improve the heat-releasing capability of the vapor chamber.

Yet another object of the present disclosure is to provide various embodiments of the plurality of lines formed at the outer surface of the vapor chamber.

In accordance with an aspect of the present disclosure, the above and other objects can be accomplished by the provision of a display device including a display panel, a frame positioned behind the display panel, a PCB coupled to the frame and including a heating element, and a vapor chamber including an internal space for fluid to flow, wherein the vapor chamber includes a heat-absorbing part in contact with the heating element, a heat-releasing part positioned above the heat-absorbing part and spaced apart from the PCB, and a plurality of lines formed at an outer side of the vapor chamber, wherein the plurality of lines extend in a first direction corresponding to an axis that connects a center of the heat-absorbing part to a center of the heat-releasing part.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
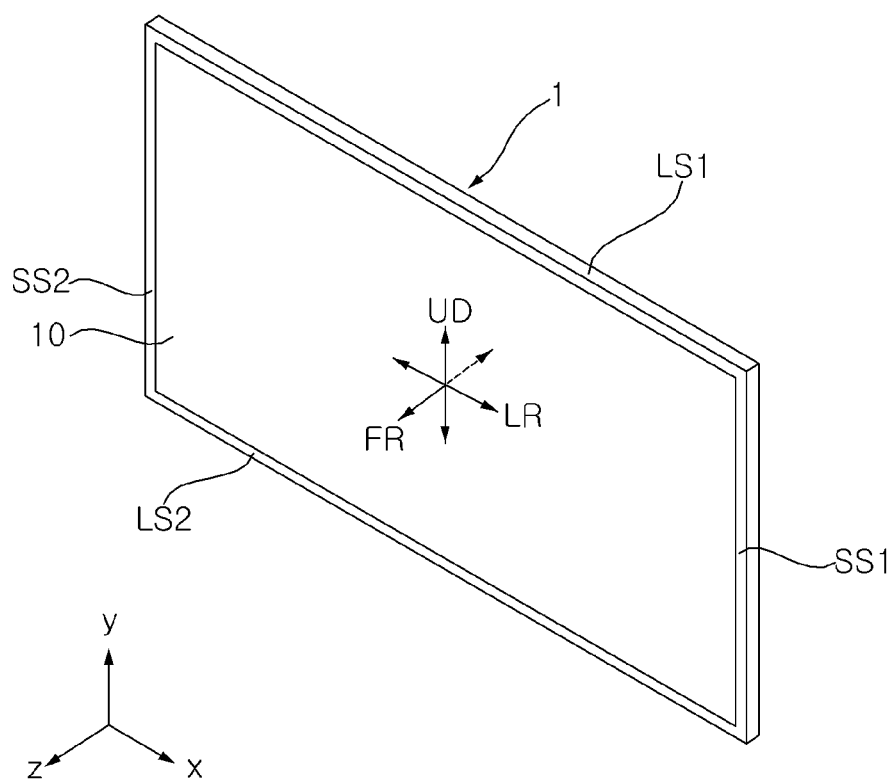
FIGS. 1 to 18 are views illustrating display devices according to embodiments of the present disclosure.

A description will now be given in detail according to exemplary embodiments disclosed herein, with reference to the accompanying drawings. For the sake of brevity of description with reference to the drawings, the same or equivalent components are denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to facilitate understanding of various technical features, and it should be understood that the embodiments presented herein are not limited by the accompanying drawings. As such, the present disclosure should be construed to extend to any alterations, equivalents and substitutes, in addition to those that are particularly set out in the accompanying drawings.

It is to be understood that, although the terms "first," "second," etc. may be used herein to describe various elements, these elements should not be limited by these terms. These terms are only used to distinguish one element from another.

It will be understood that when an element is referred to as being "connected with" another element, intervening elements may be present. In contrast, it will be understood that when an element is referred to as being "directly connected with" another element, there are no intervening elements present.

A singular representation may include a plural representation unless the context clearly indicates otherwise.

In the following description, when an example is described with reference to a specific figure, a reference numeral that is not illustrated in the specific figure may be mentioned. The reference numeral that is not illustrated with the specific figure is used in the case in which the reference numeral is indicated in other figures.

Referring to FIG. 1, the display device 1 may include a display panel 10. The display panel 10 may display a screen.

The display device 1 may include a first long side LS1, a second long side LS2, which faces the first long side LS1, a first short side SS1 adjacent to the first long side LS1 and the second long side LS2, and a second short side SS2, which faces the first short side SS1. Although each of the first and second long sides LS1 and LS2 is illustrated and described as being longer than each of the first and second short sides SS1 and SS2 for convenience of explanation, the length of each of the first and second long sides LS1 and LS2 may be almost the same as that of each of the first and second short sides SS1 and SS2.

A direction parallel to the first and second long sides LS1 and LS2 of the display device 1 may be referred to as a first direction DR1 or a lateral direction LR. A direction parallel to the first and second short sides SS1 and SS2 of the display device 1 may be referred to as a second direction DR2 or a vertical direction UD. A direction perpendicular to the first and second long sides LS1 and LS2 and the first and second short sides SS1 and SS2 of the display device 1 may be referred to as a third direction DR3 or an anteroposterior direction FR. Here, the direction in which the display panel 10 displays an image may be referred to as a forward direction, and the direction opposite the forward direction may be referred to as a rearward direction.

Although the display panel 10 will hereinafter be described based on a display panel employing organic light-emitting diodes (OLED), the display panel 10 applicable to the present disclosure is not limited thereto.

Figure 2:
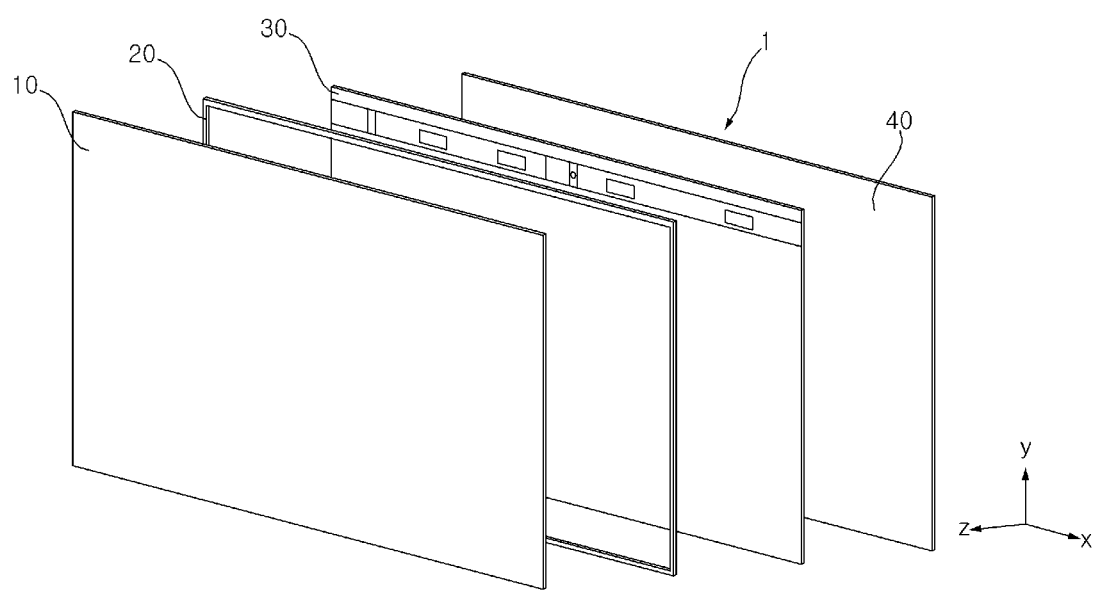

Referring to FIGS. 1 and 2, the display device 1 may include the display panel 10, a side frame 20, a frame 30, and a back cover 40.

The display panel 10 may define the front surface of the display device 1, and may display an image on the front surface of the display device 1. The display panel 10 may divide an image into a plurality of pixels, and may control the color, brightness and chroma of each of the pixels, thereby outputting the image. The display panel 10 may be divided into an active area, in which an image is displayed, and an inactive area, in which an image is not displayed. The display panel 10 may generate light corresponding to red, green or blue in response to a control signal.

The side frame 20 may define the side surface of the device 1. The side frame 20 may be positioned behind the display panel 10, and may be coupled to the display panel 10. The side frame 20 may have a rectangular ring shape overall. For example, the side frame 20 may include a metal material. For example, the side frame 20 may aluminum (Al). Meanwhile, the side frame 20 may also be referred to as a middle frame or a middle cabinet.

The frame 30 may be positioned behind the display panel 10. The frame 30 may be coupled to the side frame 20. In this case, the frame 30 may face the display panel 10, with the side frame 20 interposed therebetween. Meanwhile, the frame 30 may also be referred to as a main frame, an inner frame, or a module cover.

The back cover 40 may define the rear surface of the display device 1. The back cover 40 may be coupled to the frame 30 so as to cover the rear surface of the frame 30. In another embodiment, the back cover 40 may be omitted from the display device 1, and the frame 30 may serve as an exterior member.

Figure 3:
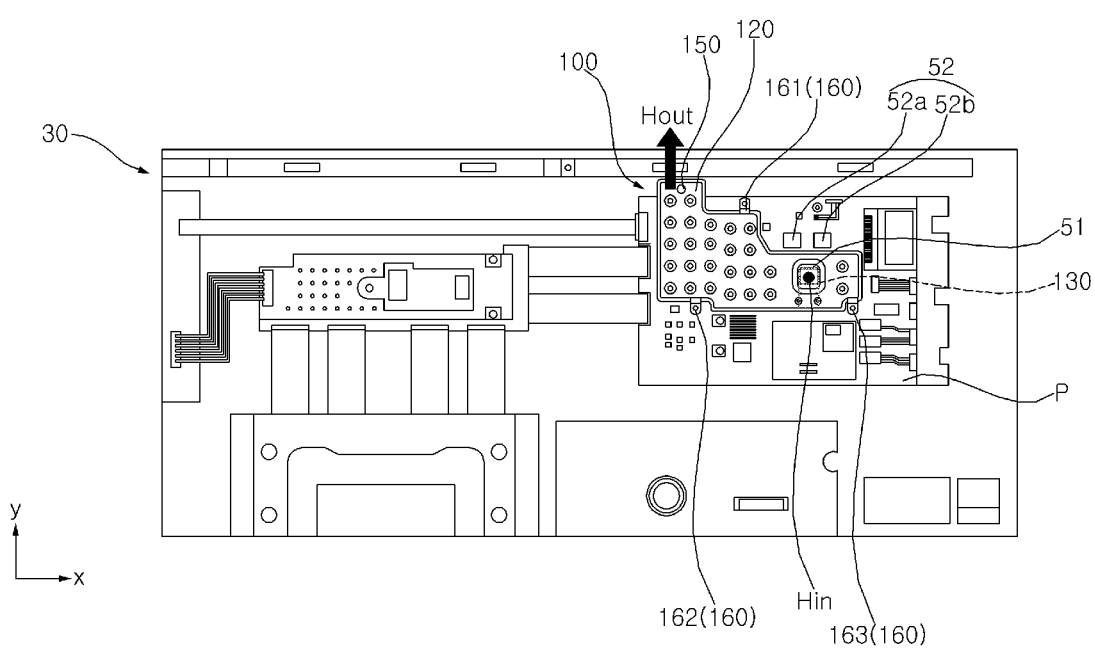

Referring to FIG. 3, various electronic components, which are electrically connected to the display panel 10, may be mounted on the frame 30. A PCB (Printed Circuit Board) P, on which a plurality of elements are mounted, may be coupled to the frame 30. For example, the PCB P may be a main board. Here, it is necessary to prevent the plurality of elements, mounted on the PCB P, from being exposed to high-temperature heat and to thus prevent thermal damage to the elements. To this end, the display device 1 may include a vapor chamber 100.

The vapor chamber 100 may be coupled to the PCB P, and may be in contact with a heating element, which is at least one of the plurality of elements mounted on the PCB P. Here, the heating element 51 may be an element configured to generate heat when current flows therethrough. For example, the heating element 51 may be an IC chip. For example, the heating element 51 may be an SOC (System On Chip). In this case, the vapor chamber 100 may release the heat transmitted from the heating element 51 to the outside. Therefore, the vapor chamber 100 is capable of preventing the heating element 51 from being overheated and thus of minimizing thermal damage to the heating element 51 and elements 52 adjacent thereto.

Figure 4:
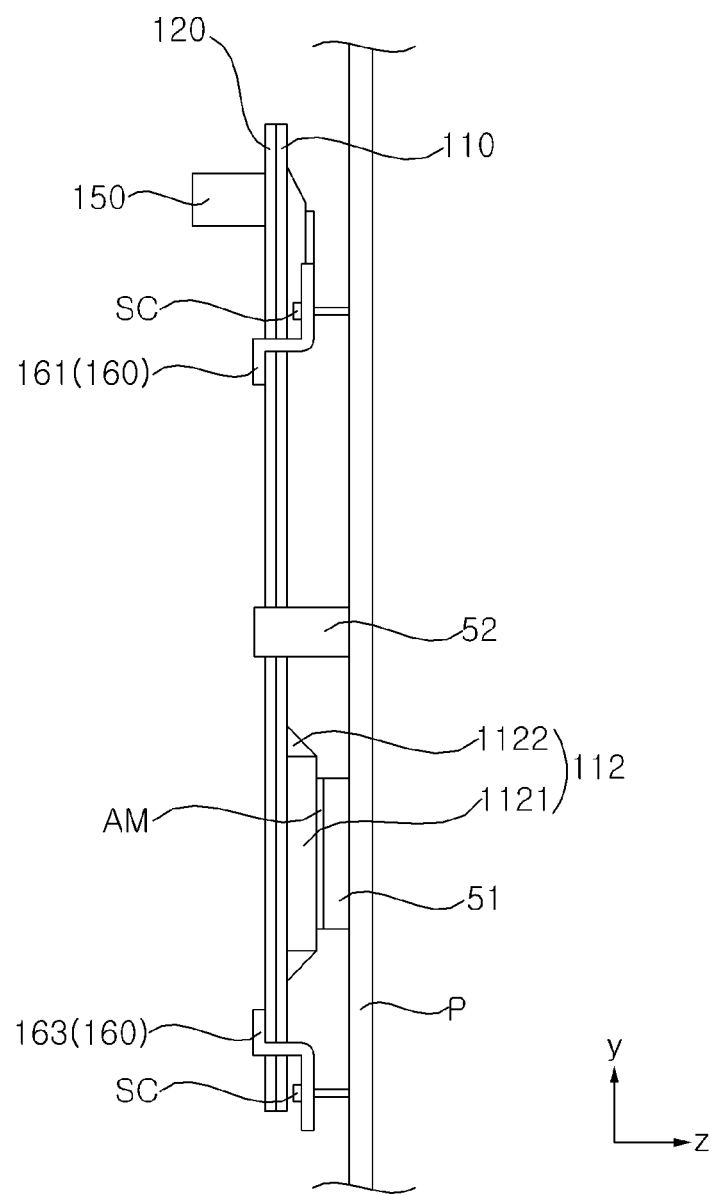

Referring to FIGS. 3 and 4, the vapor chamber 100 may include a first plate 110, a second plate 120, and fluid (not shown). The heat Hin, which is transmitted to the vapor chamber 100 from the heating element 51, may evaporate the fluid received in the internal space in the vapor chamber 100. The evaporated fluid may move upwards, and may condense while releasing heat Hout at the upper end of the vapor chamber 100 and the region near the vapor chamber 100. Subsequently, the condensed fluid moves downwards. As the above-mentioned evaporation and condensation procedures are repeatedly performed, the heating element 51 may be cooled.

Here, considering that higher-temperature fluid tends to move further upwards than lower-temperature fluid, it is preferable that a heat-releasing part, which releases the heat of the vapor chamber 100, be positioned higher than a heat-absorbing part, which absorbs heat. For example, the upper end of the vapor chamber 100 may be adjacent to the upper end of the frame 30. Here, the upper end of the frame 30 may be considered to be a portion that is adjacent to the upper end of the display device 1 and outside the display device 1. As a result, the heat from the fluid may be efficiently released at the upper end of the vapor chamber 100.

The first plate 110 may define the rear surface of the vapor chamber 100. The first plate 110 may include a heat-absorbing part 112, which is in contact with the heating element 51 and absorbs heat generated from the heating element 51. In other words, the heat generated from the heating element 51 may be transmitted to the fluid, received in the internal space in the vapor chamber 100, via the heat-absorbing part 112, thereby evaporating the fluid.

The second plate 120 may define the front surface of the vapor chamber 100. The second plate 120 may be coupled to the first plate 110. For example, the second plate 120 may be coupled to the first plate 110 via welding or the like. For example, each of the first plate 110 and the second plate 120 may include a metal material. For example, each of the first plate 110 and the second plate 120 may include stainless steel, which is excellent in corrosion resistance.

The fluid may flow or convectively move in the internal space S (see FIG. 9) defined between the first plate 110 and the second plate 120. In other words, the fluid may convectively flow in the internal space S while evaporating into a gaseous phase or condensing into a liquid phase. Specifically, the fluid may evaporate using heat energy transmitted from the heating element 51, and the heat energy of the evaporated fluid may be transmitted to the air that flows convectively outside the vapor chamber 100, whereby the fluid may condense. To this end, a portion of the inner surface of the first plate 110 may be spaced apart from a portion of the inner surface of the second plate 120 so as to define the internal space S. For example, the fluid may be water.

The vapor chamber 100 may include an adhesive AM. The adhesive AM may be disposed between the heat-absorbing part 112 and the heating element 51, and may be adhered thereto. Since the adhesive AM has excellent heat conductivity, the heat generated from the heating element 51 may be easily transmitted to the heat-absorbing part 112. For example, the adhesive AM may be double-sided adhesive tape.

Figure 5:
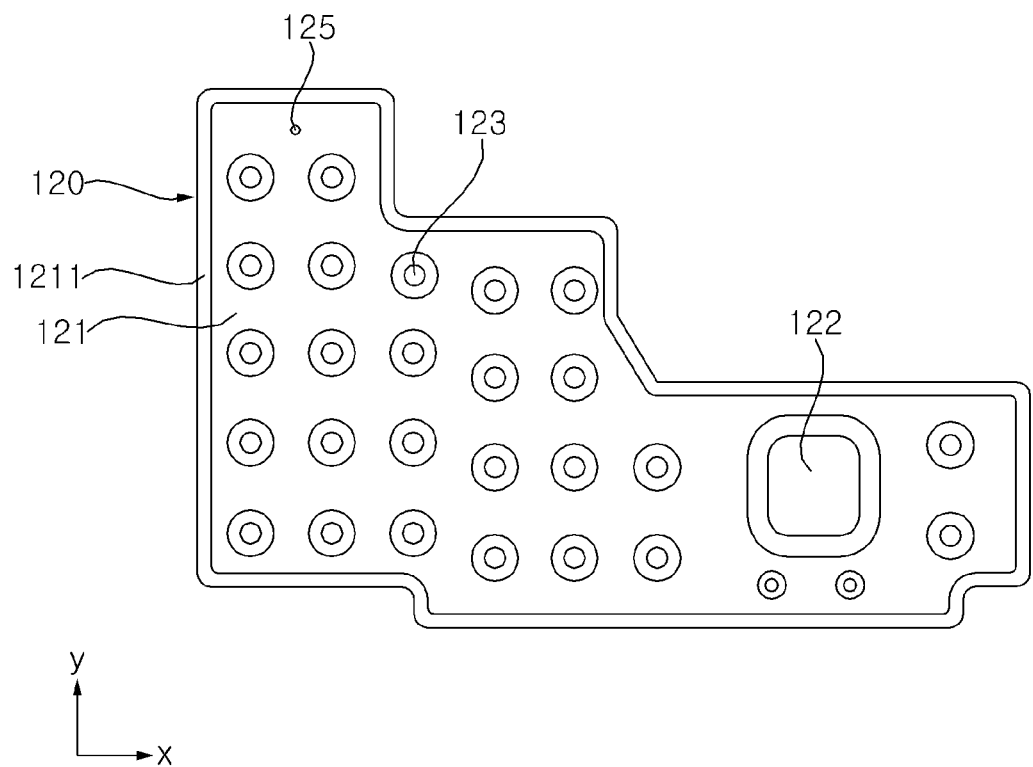
Figure 6:
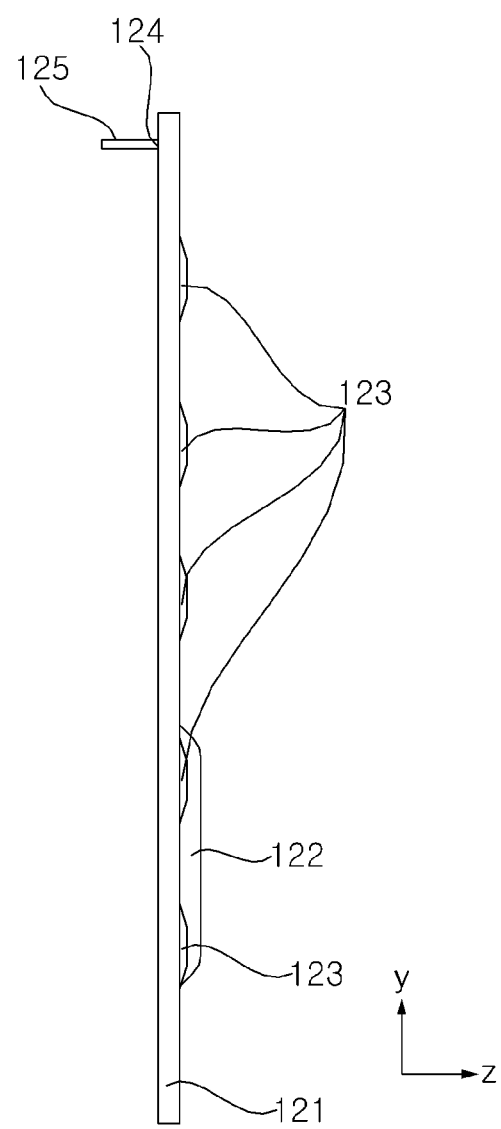

Referring to FIGS. 5 and 6, the second plate 120 may include a second body 121 having formed therein an inflow hole, through which the fluid is supplied into the internal space S. For example, after the fluid is supplied into the internal space S through the inflow hole 124, the internal space S may be vacuumed using a vacuum device (not shown). For example, a pipe 125, through which the fluid flows, may be fitted into the inflow hole 124. For example, the pipe 125 may be a copper pipe.

A plurality of recesses 123 may be depressed toward the internal space S from the second body 121. For example, each of the plurality of recesses 123 may take the form of an embossment. The plurality of recesses 123 may prevent the second plate 120 from coming into close contact with the first plate 110 while the internal space S is vacuumed. Consequently, the internal space S may have a predetermined size and may be vacuumed by virtue of the plurality of recesses 123.

Figure 7:
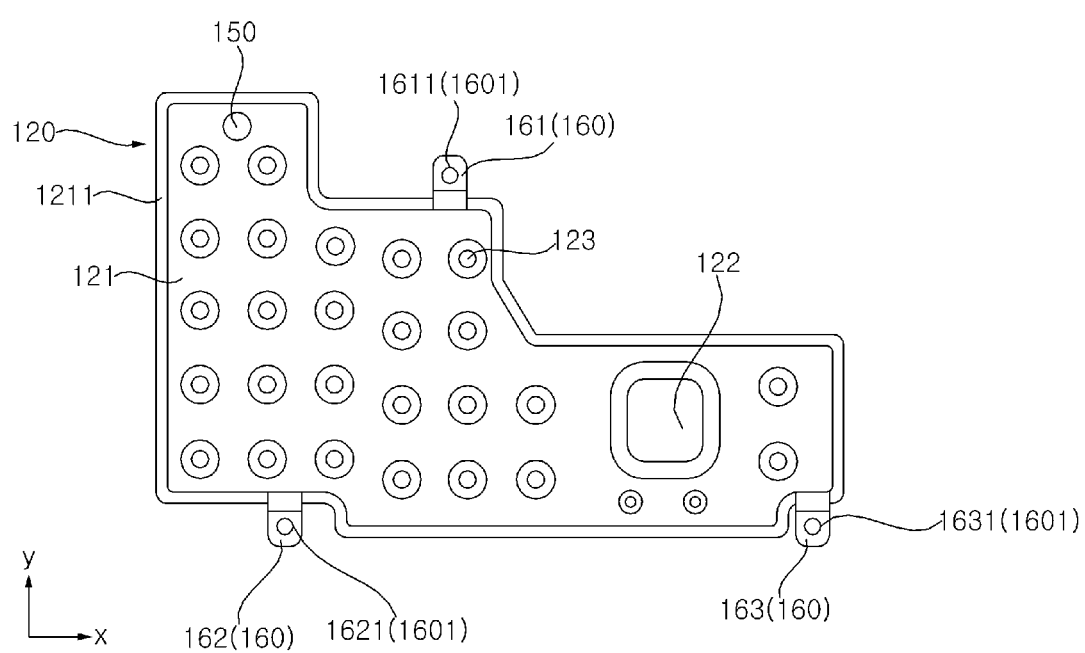

Referring to FIG. 7, a cap 150 may be coupled to the second body 121 of the second plate 120 so as to cover the pipe 125. For example, the cap 150 may be formed so as to have a cylindrical shape. For example, the cap 150 may include a rubber material.

For example, the cap 150 may extend in an anteroposterior direction (see FIG. 4). Here, the gap between components that are positioned ahead of the second plate 120 and the second plate 120 may become longer than the length of the cap 150. Hence, it is possible to prevent the components positioned ahead of the second plate 120 from coming into contact with the second plate 120.

A bracket 160 may be coupled at one end thereof to the second plate 120 and at the other end thereof to the PCB P (see FIG. 4). In other words, the second plate 120 may be coupled to the PCB P via the bracket 160. For example, the bracket 160 may include a plurality of brackets 161, 162 and 163, which are spaced apart from one another.

For example, the other end of the bracket 160 may be spaced apart from the PCB P. The other end of the bracket 160 may have formed therein a hole 1601, and a fastening element SC (see FIG. 4) may be fastened to the PCB P through the hole 1601. For example, the fastening element SC may be a screw. Here, it is possible to adjust the force with which the second plate 120 is coupled to the PCB P by adjusting the fastening strength of the fastening element SC relative to the PCB P.

Consequently, since the heat-absorbing part 112 is brought into closer contact with the heating element 51, the heat generated from the heating element 51 may be more reliably transmitted to the heat-absorbing part 112. Alternatively, the second plate 120 may also be coupled to the PCB P via another process such as welding.

For example, the bracket 160 may include a metal material. For example, the bracket 160 may include chrome (Cr).

Figure 8:
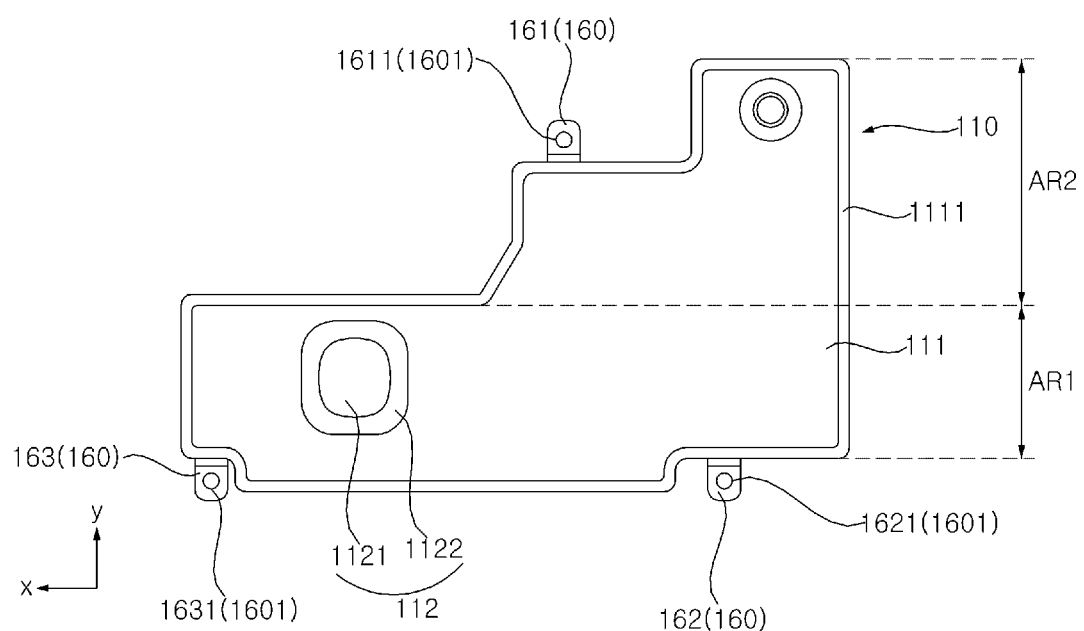

Referring to FIGS. 3 and 8, the first plate 110 may be configured to have a flat shape overall. The first plate 110 may be provided with the heat-absorbing part 112, which is in contact with the heating element 51. Furthermore, the first plate 110 may be provided with a heat-releasing part 113, which is positioned above the heating-absorbing part 112 and is spaced apart from the PCB P. Hence, the heat energy of the fluid may be released to the outside at the heat-releasing part 113. Here, the heat-absorbing part 112 may be referred to as an evaporation unit, and the heat-releasing part 113 may be referred to as a condensation unit.

The vapor chamber 100 may include a first area AR1, in which the fluid is intensively evaporated, and a second area AR2, in which the fluid is intensively condensed. Here, the second area AR2 may be positioned above the first area AR1. The heat-absorbing part 112, which is in contact with the heating element 51 and in which the fluid is most intensively evaporated, may be included in the first area AR1. Meanwhile, the heat-releasing part 113, which is positioned near the upper end of the vapor chamber 110 and in which the fluid is most intensively condensed, may be included in the second area AR2.

Furthermore, the heat-absorbing part 112 that is in contact with the heating element 51 may be provided at the first plate 110, and the heat-releasing part 113 at which the heat of the fluid is released to the outside may be provided at the second plate 120 as well as at the first plate 110. In this case, the heat-releasing part at the second plate 120 may face the heat-releasing part at the first plate 110 in an anteroposterior direction. For example, the heat-releasing part of the second plate 120 may be formed at the region of the second plate 120 at which the cap 150 (see FIG. 7) is provided.

The first plate 110 may extend upwards from the heat-absorbing part 112 while bypassing the projecting element 52, which is an element overlapping the first plate 110 among the plurality of elements mounted on the PCB P in a vertical direction, so as to prevent the first plate 110 from overlapping the projecting element 52. Since the first plate 110 and the second plate 120 are formed so as to have the same shape overall, the shape of the vapor chamber 100, which has a relationship with the projecting element 52 will be described based on the first plate 110 for brevity of explanation.

Accordingly, although the projecting element 52, which projects forwards, is positioned closer to the first plate 110 than is the heating element 51, the first plate 110 may not interfere with the projecting element 52. In other words, since contact between the vapor chamber 110 and the projecting element 52 is prevented, evaporation and condensation of the fluid may be efficiently performed.

For example, the projecting element 52 may include a plurality of projecting elements 52a and 52b, which are spaced apart from each other. In this case, the first plate 110 may bypass the plurality of projecting elements 52a and 52b in the same direction. Specifically, when the first plate 110 bypasses one of the plurality of projecting elements 52a and 52b in a first direction, the first plate 110 may bypass the remaining projecting element in the first direction.

Accordingly, in comparison with the case in which the first plate 110 is configured so as to bypass the plurality of projecting elements 52 in different directions, it is possible to minimize the resistance to the fluid flowing in the internal space S. As a result, the heating elements 51 may be efficiently cooled through the vapor chamber 100.

Referring to FIGS. 4 and 8, the heat-absorbing part 112 and the heat-releasing part 113 may be formed at the first body 111 of the first plate 110. The heat-absorbing part 112 may project from the first body 111 outwards or rearwards. In other words, the heat-absorbing part 112 may be positioned closer to the PCB P than is the remaining portion of the first body 111 excluding the heat-absorbing part 112.

Consequently, since not only the contact between the heat-absorbing part 112 and the heating element 51 but also the contact between the remaining portion of the first body 111 excluding the heat-absorbing part and the elements mounted on the PCB P is prevented, evaporation and condensation of the fluid may be efficiently performed.

The lower end of the first plate 110 may be spaced apart from the heat-absorbing part 112. For example, the lower end of the first plate 110 may be spaced apart from the heat-absorbing part 112 due to the position of the heating element 51, the size and shape of the vapor chamber 100, the position, size and shape of the elements mounted on the PCB P, and the like.

Here, the vapor chamber 100 may include a sheet 130 (see FIG. 3). The sheet 130 may move the liquid-phase fluid, which accumulates at the lower end of the first plate 110, to the heat-absorbing part 112. To this end, one end of the sheet 130 may be positioned at the lower end of the first plate 110, and the other end of the sheet 130 may be positioned at the upper end of the heat-absorbing part 112. Consequently, the liquid-phase fluid, which accumulates at the lower end of the first plate 110, may move to the heat-absorbing part 112 through the sheet 130, and may evaporate at the heat-absorbing part 112.

For example, the sheet 130 may move the liquid-phase fluid, which accumulates at the lower end of the first plate 110, to the heat-absorbing part 112 through capillary action. For example, the sheet 130 may include a porous material. For example, the sheet 130 may include a fiber material. For example, the sheet 130 may have a thickness of 0.5 mm. The sheet 130 may be referred to as a micro filter.

Figure 9:
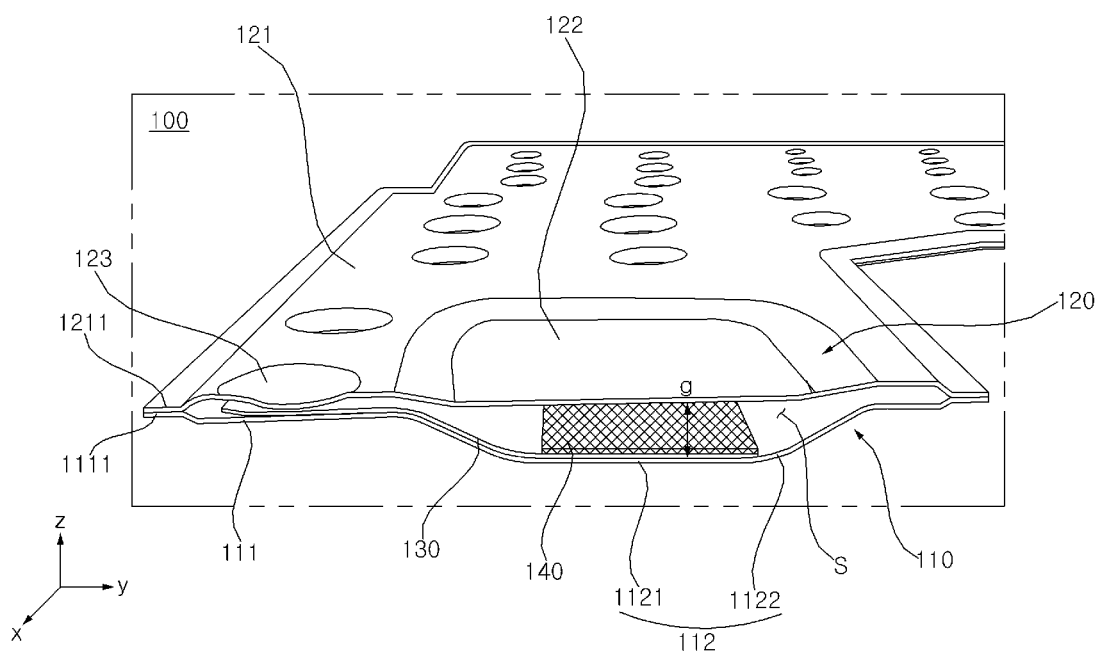

Referring to FIG. 9, a first flange 1111, which defines the periphery of the first body 111, and a second flange 1211, which defines the periphery of the second body 121, may be coupled to each other while facing each other. For example, the first flange 1111 and the second flange 1211 may be coupled to each other via welding or the like. Here, the inner surface of the first body 111 excluding the first flange 1111 may be spaced apart from the inner surface of the second body 121 excluding the second flange 1211 so as to define the internal space S.

The heat-absorbing part 112 may include a seating portion 1121 and a slope portion 1122. A portion of the sheet 130 may be seated on the seating portion 1121. The seating portion 1121 may be in contact with the heating element 51. For example, the seating portion 1121 may have a flat shape overall. The slope portion 1122 may connect the seating portion 1121 to the first body 111. The slope portion 1122 may be inclined with respect to the seating portion 1121 by a predetermined obtuse angle. Here, the sheet 130, the one end of which is positioned adjacent to the lower end of the first plate 110, may extend upwards along the slope portion 1122, and may be seated on the seating portion 1121.

The sheet 130 may be spaced apart from the inner surface of the second plate 120 or the inner surface of the second body 121. The distance between the sheet 130 and the inner surface of the second plate 120 or the second body 121 may have the maximum value at the location at which the sheet 130 is seated on the seating portion 1121. For example, a recess 122 in the second plate 120, which faces the seating portion 1121 with the sheet 130 interposed therebetween, may be depressed inwards from the second body 121 by about 1.0 mm, and may be spaced apart from the seating portion 1121 by a gap g of about 3.6 mm.

Accordingly, since the fluid that is absorbed in the sheet 130 and moves to the seating portion 1121, may be evaporated into a gaseous phase by the heat transmitted from the heating element 51, the gas-phase fluid may efficiently flow through the space S.

Figure 10:
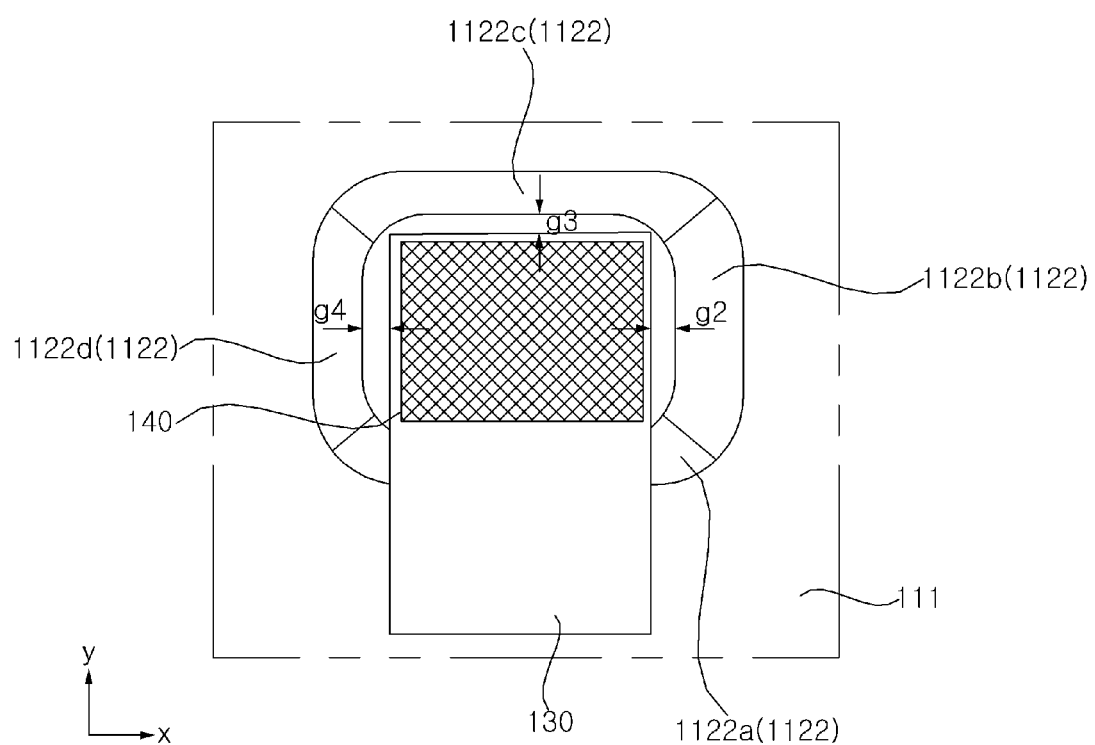

Referring to FIGS. 9 and 10, the seating portion 1121 may have a rectangular shape overall. Here, the slope portion 1122 may include first to fourth slope portions 112a, 1122b, 1122c and 1122d, which extend from the respective sides of the seating portion 1121. The first slope portion 1122a may be positioned between the one end and the other end of the sheet 130. In other words, the sheet 130, the one end of which is positioned at the lower end of the first plate 110, may extend upwards along the first slope portion 1122a, and may be seated on the seating portion 1121.

The sheet 130 may be spaced apart from the second to fourth slope portions 1122b, 1122c and 1122d, other than the first slope portion 1122a, which is positioned between the one end and the other end of the sheet 130. For example, the left side of the sheet 130 may be spaced apart from the second slope portion 1122b, which is positioned at the left side of the seating portion 1121, by a predetermined distance g2. For example, the upper side of the sheet 130 may be spaced apart from the third slope portion 1122c, which is positioned at the upper side of the seating portion 1121, by a predetermined distance g3. For example, the right side of the sheet 130 may be spaced apart from the fourth slope portion 1122d, which is positioned at the right side of the seating portion 1121, by a predetermined distance g4.

Specifically, since the sheet 130 is positioned at the seating portion 1121 without overlapping the second to fourth slope portions 1122b, 1122c and 1122d, it is possible to minimize a reduction in the internal space S between the second to fourth slope portions 1122b, 1122c and 1122d and the second body 121 caused by the sheet 130, which has an increased volume due to absorption of the fluid.

It will be appreciated that the reason why the distance between the second body 121 and the seating portion 1121 is greater than the distance between the second body 121 and the slope portion 1122 is to ensure sufficient internal space S to allow the fluid to efficiently flow between the seating portion 1121 and the second body 121 even when the volume of the sheet 130 is increased.

Accordingly, even when the volume of the sheet 130 is increased due to absorption of the fluid, the fluid that evaporates from the sheet 130 may efficiently flow through the inner space S. Furthermore, it is possible to prevent generation of noise caused by boiling of the fluid accumulating in the heat-absorbing part 112.

A mesh 140 may face the seating portion 1121, with the sheet 130 interposed therebetween. The mesh 140 may have therein a plurality of voids. The mesh 140 may be coupled to the sheet 130. The mesh 140 may reduce the noise that is generated when the bubbles in the fluid emerging from the sheet 130 burst. Specifically, since the size of the bubbles that are created when the fluid evaporates from the sheet 130 is decreased by virtue of the plurality of voids in the mesh 140, the bubbles may be eliminated without intense noise.

For example, the mesh 140 may have a rectangular shape overall. For example, the mesh 140 may include a metal material. For example, the mesh 140 may include stainless steel, which has excellent corrosion resistance.

Figure 11:
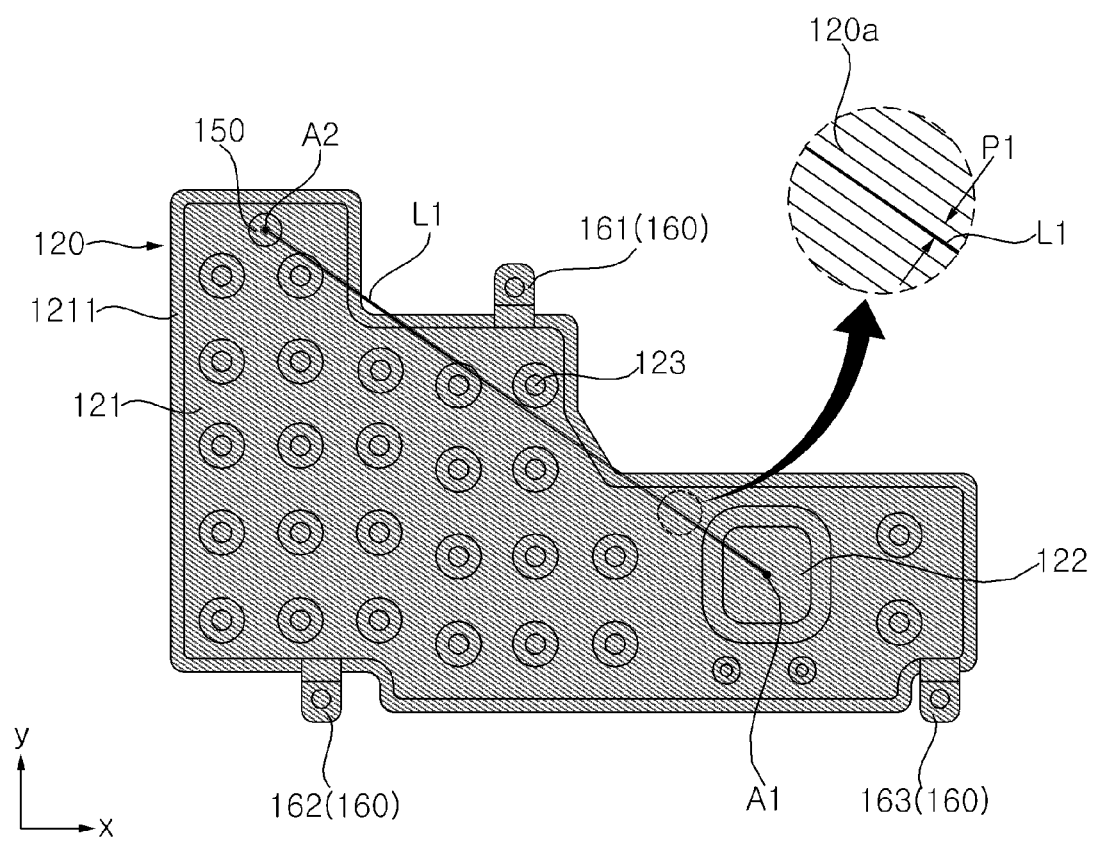

Referring to FIG. 11, a plurality of lines 120a may be formed at the outer surface of the second plate 120. Each of the plurality of lines 120a may be formed at the outer surface of the second plate 120 so as to have the shape of a very narrow groove. For example, the plurality of lines 120a may be formed at the outer surface of the second plate 120 through a laser cutting process.

Consequently, since the surface area of the second plate 120 is increased, the heat energy of the fluid may be easily transmitted to the air that flows convectively outside the second plate 120. As a result, the evaporated fluid may be efficiently condensed, and thus the heat-releasing capability of the vapor chamber 100 may be improved. It goes without saying that the heat energy of the fluid may also be transmitted to the air that flows convectively outside the first plate 110.

The heat-absorbing part 112 of the first plate 110 may face the recess 122 of the second plate 120, and the center A1 of the heat-absorbing part 112 and the center of the recess 122 may be positioned on a line that extends in an anteroposterior direction. For example, the heat-releasing part of the second plate 120 may be formed at a region at which the cap 150 of the second plate 120 is provided. The heat-releasing part 113 of the first plate 110 may face the heat-absorbing part of the second plate 120, and the center A2 of the heat-releasing part 113 and the center of the cap 150 may be positioned on a line that extends in an anteroposterior direction.

The center A2 of the heat-releasing part 113 may be positioned above and to the right of the center A1 of the heat-absorbing part 112. Here, an imaginary line L1 that connects the center A1 of the heat-absorbing part 112 to the center A2 of the heat-releasing part 113, may extend in a direction intersecting the vertical direction. The fluid in the internal space S may evaporate, and may then flow upwards and rightwards. In other words, the direction in which the evaporated fluid flows may not greatly deviate from the direction in which the imaginary line L1 extends.

The plurality of lines 120a may extend in a direction defined with reference to the imaginary line L1. Specifically, the plurality of lines 120a may extend in a direction parallel to the imaginary line L1, and may be spaced apart from each other at regular intervals P1. For example, the regular interval P1 may range from 0.8 mm to 1.2 mm.

Consequently, since the surface area of the second plate 120 is increased by virtue of the plurality of lines 120a, the heat energy of the fluid may be more easily transmitted to the air that flows convectively outside the second plate 120. As a result, the evaporated fluid may be more efficiently condensed, and thus the heat-releasing capability of the vapor chamber 100 may be further improved.

In addition to or in place of the plurality of lines 120a formed at the outer surface of the second plate 120, a plurality of lines 110a may be formed at the outer surface of the first plate 110. The plurality of lines 110a formed at the outer surface of the first plate 110 may overlap the plurality of lines 120a formed at the outer surface of the second plate 120 in an anteroposterior direction.

Consequently, since the plurality of lines are formed at the outer surface of the first plate 110 as well as the outer surface of the second plate 120, the efficiency with which the heat of the fluid is transmitted to the air that flows convectively outside the first plate 110 and the second plate 120, may be improved, and the heat-releasing capability of the vapor chamber 100 may be greatly improved.

Figure 12:
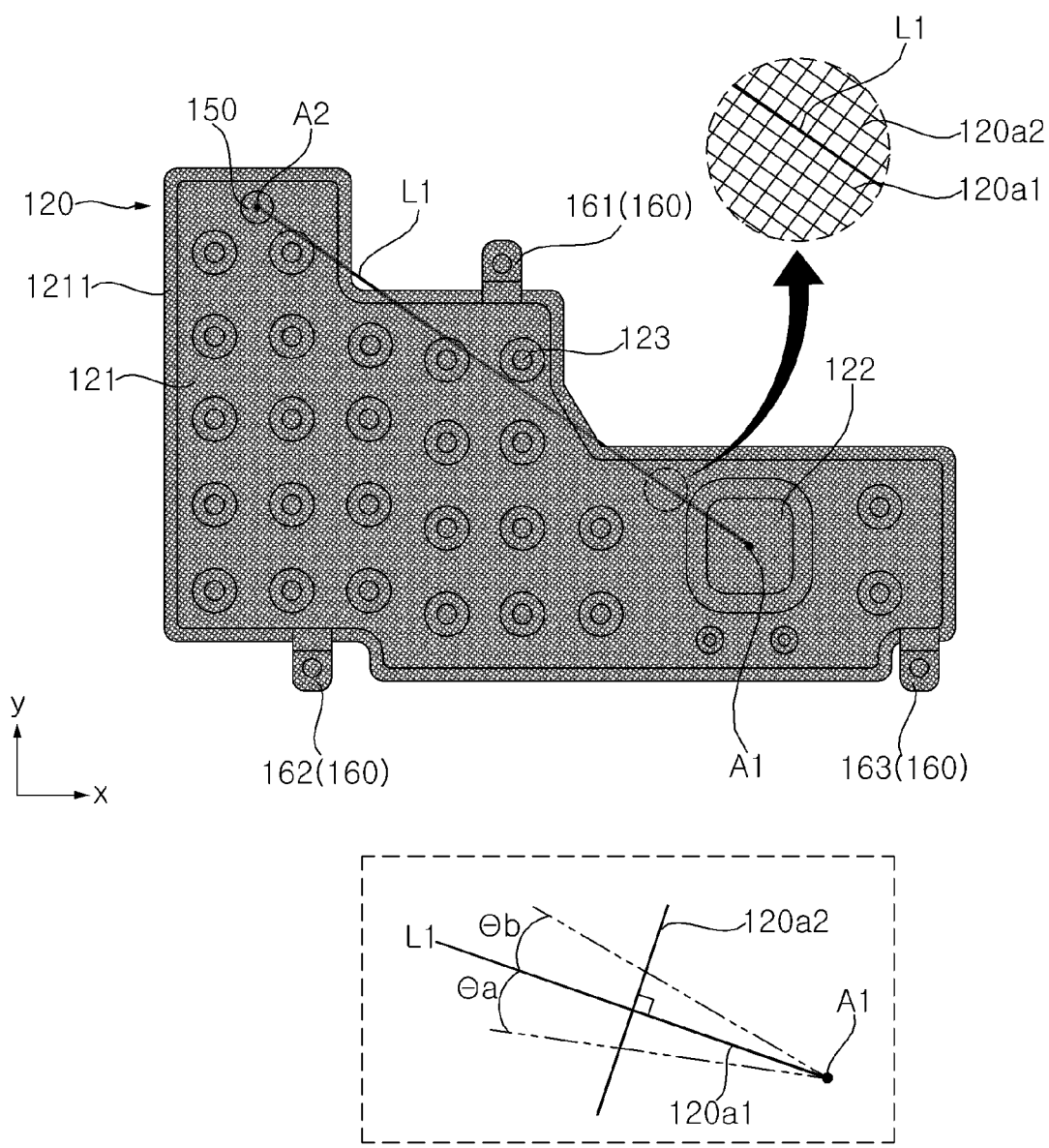

Referring to FIG. 12, the plurality of lines 120a may include a plurality of first lines 120a1 and a plurality of second lines 120a2.

The plurality of first lines 120a1 may extend in a direction that is inclined with respect to the imaginary line L1 by a predetermined angle, and may be spaced apart from each other. For example, the longitudinal direction of the plurality of first lines 120a1 may be the same as the direction of the imaginary line L1. Alternatively, the longitudinal direction of the plurality of first lines 120a1 may be inclined downwards with respect to the imaginary line L1 by a first angle a, or may be inclined upwards with respect to the imaginary line L1 by a second angle b.

The plurality of second lines 120a2 may intersect the plurality of first lines 120a1, and may be spaced apart from each other. For example, the plurality of second lines 120a2 may intersect the plurality of first lines 120a1.

For example, the interval between the plurality of first lines 120a1 may be equal to the interval between the plurality of second lines 120a2.

Consequently, since the surface area of the second plate 120 is further increased, the heat energy of the fluid may be more easily transmitted to the air that flows convectively outside the second plate 120, and thus the heat-releasing capability of the vapor chamber 100 may be further improved.

Figure 13:
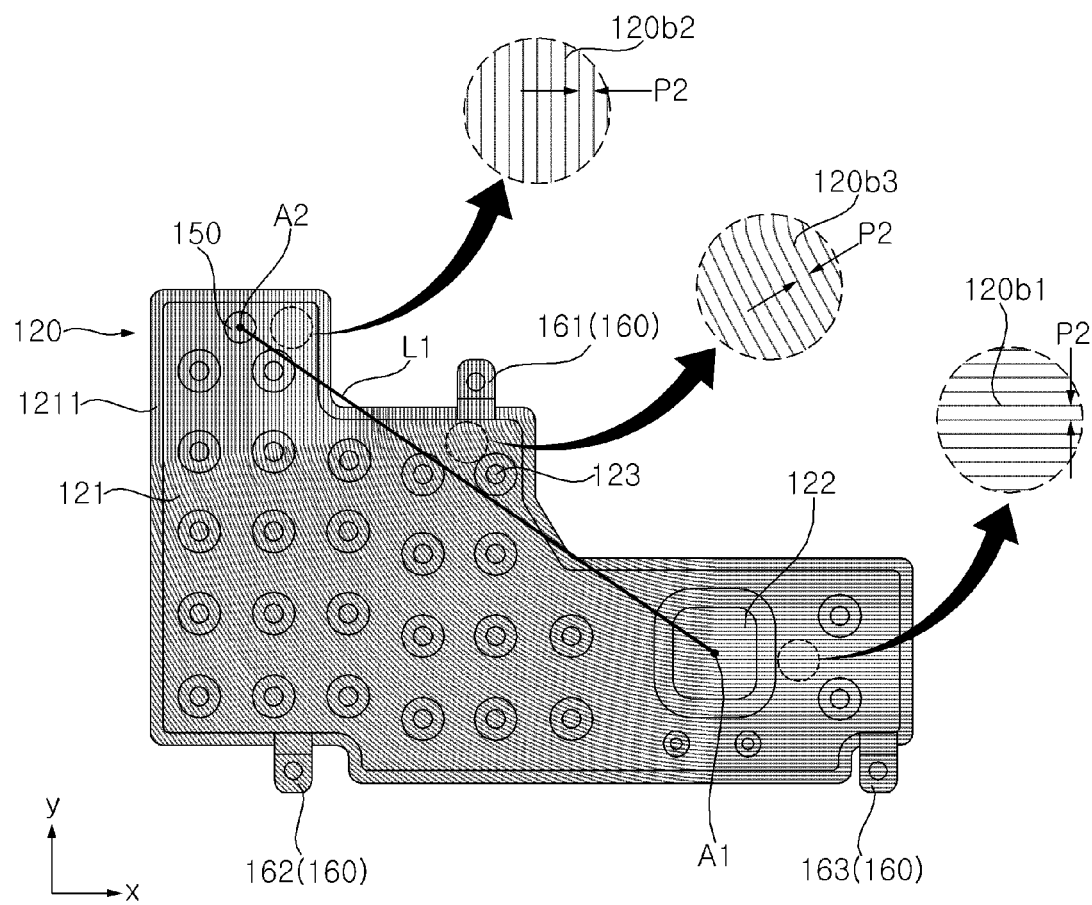
Figure 13:
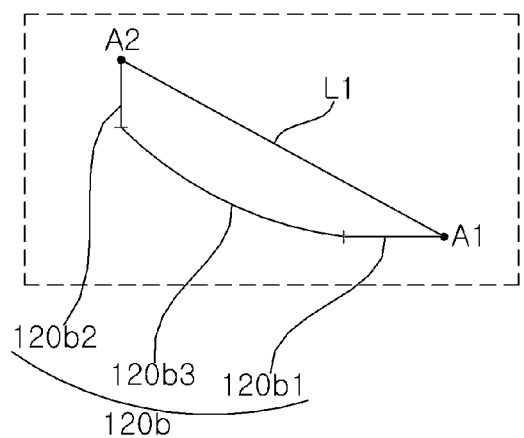

Referring to FIG. 13, a plurality of first lines 120b may be formed at the outer surface of the second plate 120. Each of the plurality of first lines 120b may be formed at the outer surface of the second plate 120 so as to have the shape of a very narrow groove. For example, the plurality of first lines 120b may be formed at the outer surface of the second plate 120 through a laser cutting process.

Consequently, since the surface area of the second plate 120 is increased, the heat energy of the fluid may be easily transmitted to the air that flows convectively outside the second plate 120. As a result, the evaporated fluid may be efficiently condensed, and the heat-releasing capability of the vapor chamber 100 may be improved. It goes without saying that the heat energy of the fluid may also be transmitted to the air that flows convectively outside the first plate 110.

The center A2 of the heat-releasing part 113 may be positioned above and to the right of the center A1 of the heat-absorbing part 112. Here, an imaginary line L1, which connects the center A1 of the heat-absorbing part 112 to the center A2 of the heat-releasing part 113, may extend in a direction intersecting the vertical direction. The fluid in the internal space S may evaporate and may then flow upwards and rightwards. In other words, the direction in which the evaporated fluid flows may be similar overall to the direction in which a line, which is convex downwards in a direction defined with reference to the imaginary line L1, extends.

Here, the plurality of first lines 120b may extend in a direction defined with reference to the imaginary line L1. Specifically, the plurality of first lines 120b may extend in a direction parallel to a curved line, which is convex downwards with reference to the imaginary line L1, and may be spaced apart from each other. For example, the plurality of first lines 120b may be spaced apart from each other at regular intervals P2. Here, the regular interval P2 may range from 0.8 mm to 1.2 mm.

For example, each of the plurality of first lines 120b may include a first section 120b1, a second section 120b2 and a third section 120b3. The first section 120b1 may extend horizontally near the center A1 of the heat-absorbing part 112. The second section 120b2 may extend vertically near the center A2 of the heat-releasing part 113. The third section 120b3 may be disposed between the first section 120b1 and the second section 120b2 and may be connected thereto, and may define a curved line.

Consequently, since the surface area of the second plate 120 is increased by virtue of the plurality of first lines 120b, the heat energy of the fluid may be more easily transmitted to the air that flows convectively outside the second plate 120. As a result, the evaporated fluid may be more efficiently condensed, and thus the heat-releasing capability of the vapor chamber 100 may be further improved.

In addition to or in place of the plurality of first lines 120b formed at the outer surface of the second plate 120, a plurality of first lines 110b may be formed at the outer surface of the first plate 110. The plurality of first lines 110b formed at the outer surface of the first plate 110 may overlap the plurality of first lines 120b formed at the outer surface of the second plate 120 in an anteroposterior direction.

Consequently, since the plurality of lines are formed at the outer surface of the first plate 110 as well as the outer surface of the second plate 120, the efficiency with which the heat of the fluid is transmitted to the air that flows convectively outside the first plate 110 and the second plate 120, may be improved, and the heat-releasing capability of the vapor chamber 100 may be greatly improved.

Figure 14:
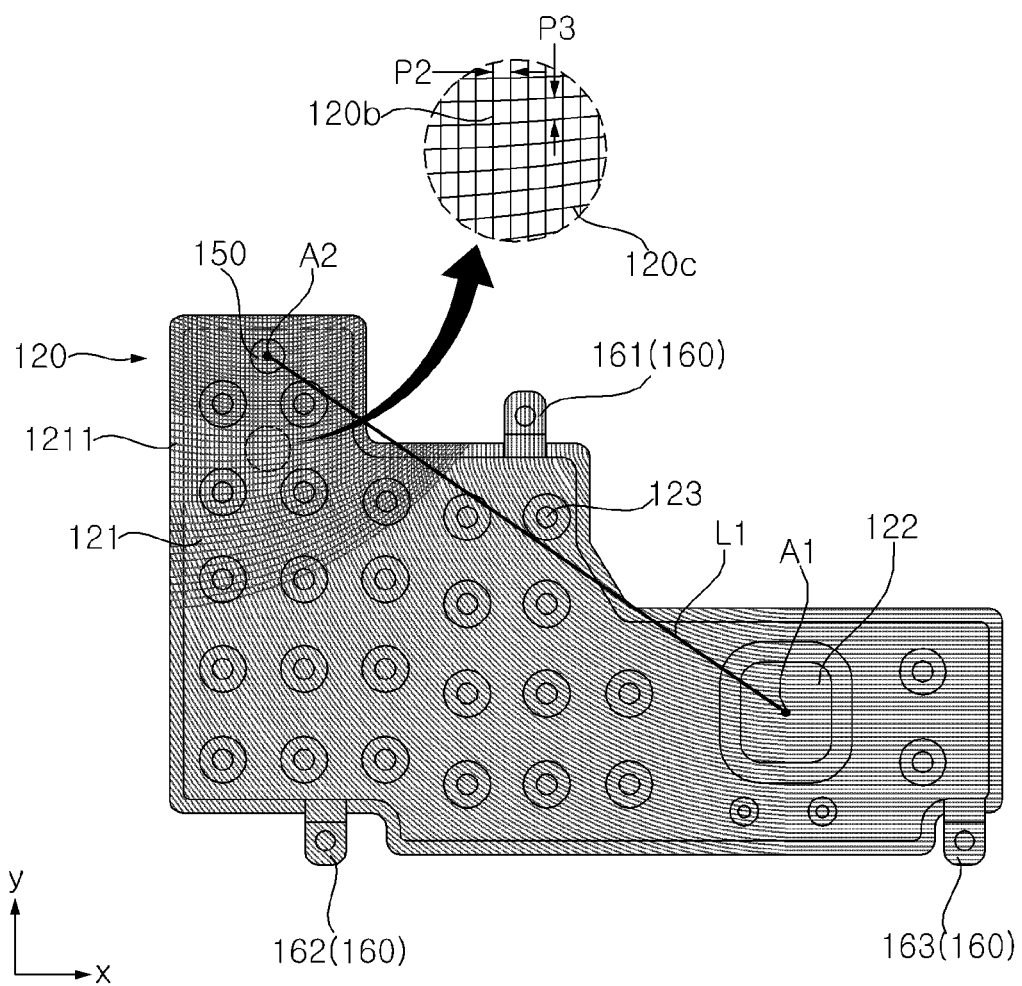
Figure 15:
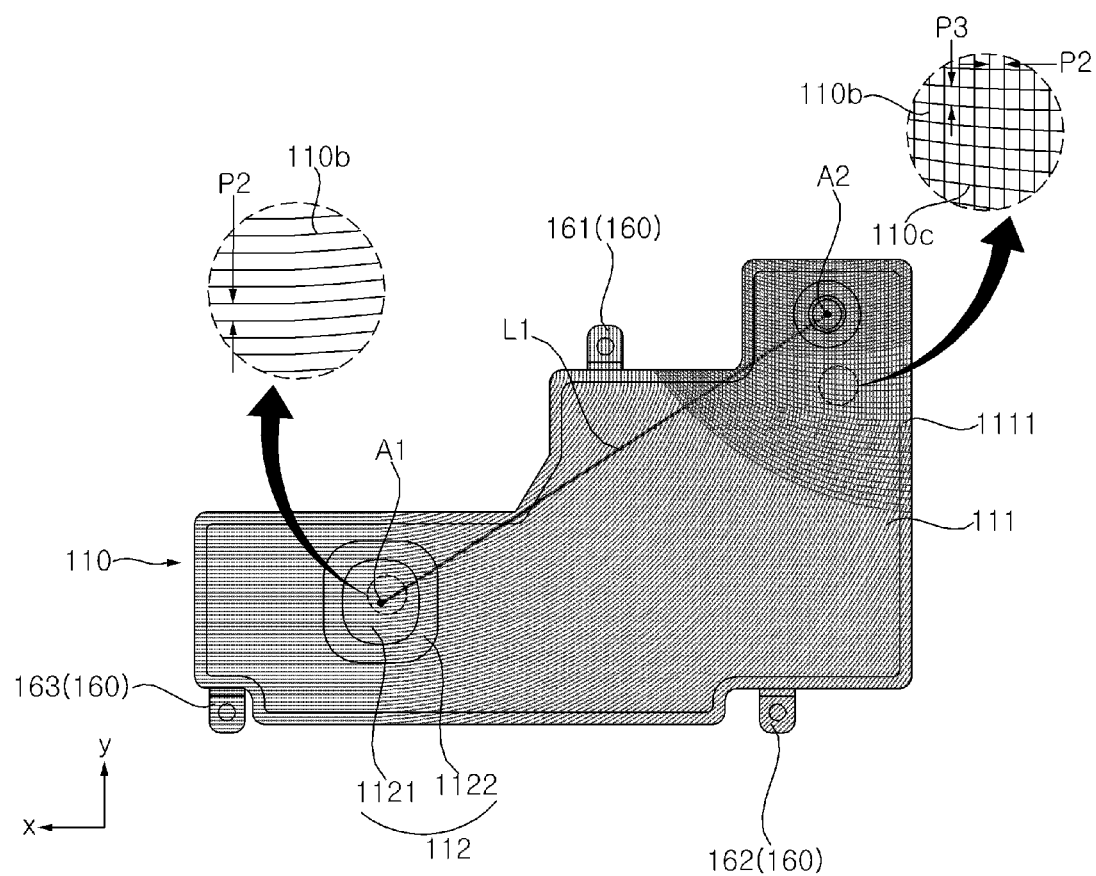

Referring to FIGS. 14 and 15, a plurality of second lines 120c may be formed at the outer surface of the second plate 120. The plurality of second lines 120c may intersect the plurality of first lines 120b, and may be spaced apart from each other. For example, the plurality of second lines 120c may be spaced apart from each other at regular intervals P3.

Each of the plurality of second lines 120c may be formed at the outer surface of the second plate 120 so as to have the shape of a very narrow groove. For example, the plurality of second lines 120c may be formed at the outer surface of the second plate 120 through a laser cutting process.

For example, the plurality of second lines 120c may extend in a direction parallel to a curved line that is convex downwards with reference to a line that extends horizontally. Hence, the plurality of second lines 120c may not overlap the first sections 120b1, the second sections 120b2 or the third sections 120b3 of the plurality of first lines 120b.

Consequently, since the surface area of the second plate 120 is further increased, the heat energy of the fluid may be more easily transmitted to the air that flows convectively outside the second plate 120, and thus the heat-releasing capability of the vapor chamber 100 may be further improved.

For example, the plurality of second lines 120c may be formed at the outer surface of the second plate 120 near the center A2 of the heat-releasing part 113. Accordingly, condensation of the fluid or heat dissipation may intensively occur in an area near the center A2 of the heat-releasing part 113.

In addition to or in place of the plurality of second lines 120c formed at the outer surface of the second plate 120, a plurality of second lines 110c may be formed at the outer surface of the first plate 110. The plurality of second lines 110c formed at the outer surface of the first plate 110 may overlap the plurality of second lines 120c formed at the outer surface of the second plate 120. In other words, the plurality of second lines 110c formed at the outer surface of the first plate 110 may intersect the plurality of first lines 110b formed at the outer surface of the first plate 110, and may be spaced apart from each other.

Consequently, since the plurality of lines are formed at the outer surface of the first plate 110 as well as the outer surface of the second plate 120, the efficiency with which the heat of the fluid is transmitted to the air that flows convectively outside the first plate 110 and the second plate 120, may be improved, and thus the heat-releasing capability of the vapor chamber 110 may be greatly improved.

Figure 16:
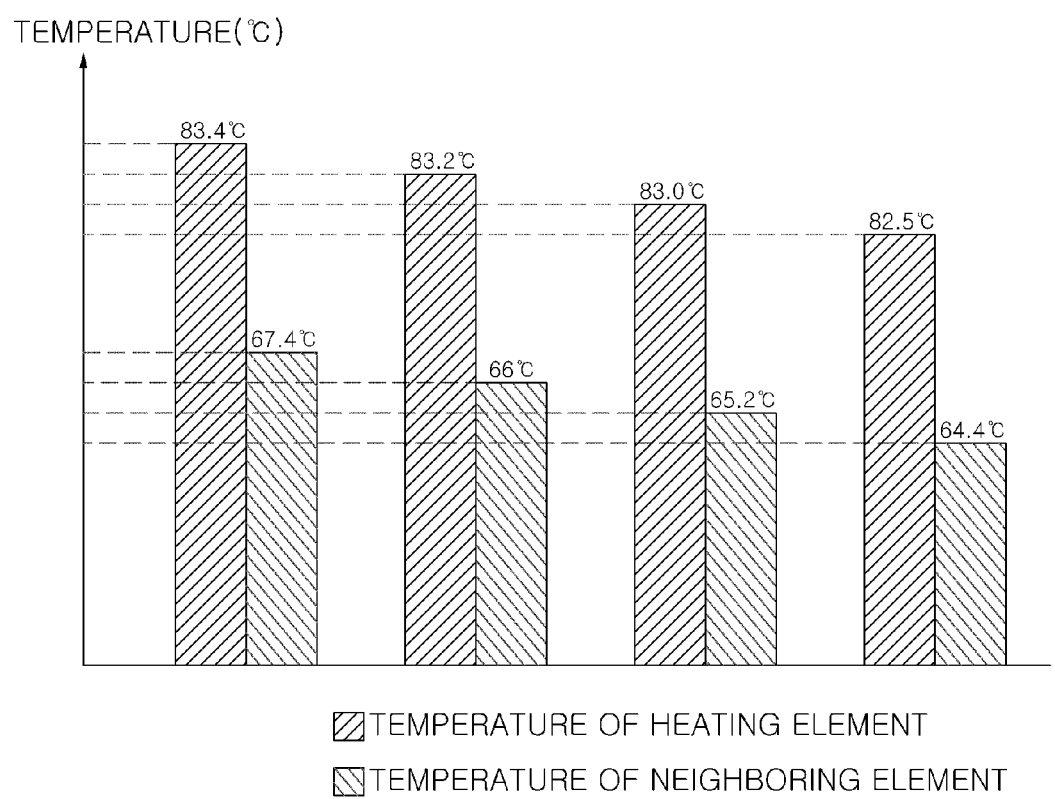

Referring to FIG. 16, in the case in which the plurality of lines are not formed at the outer surface of the vapor chamber 100, the maximum temperature of the heating element 51 may be 83.4° C. and the maximum temperature of the neighboring element 52 may be 67.4° C. under a certain load condition. In contrast, when the plurality of lines are formed at the outer surface of the vapor chamber 100, not only the temperature of the heating element 51 but also the temperature of the neighboring element 52 adjacent to the vapor chamber 100 may be efficiently lowered under the same load condition.

Specifically, when the plurality of lines 120a are formed at the outer surface of the second plate 120, as described with reference to FIG. 11, the maximum temperature of the heating element 51 may be 83.2° C., and the maximum temperature of the neighboring element 52 may be 66° C. In other words, it can be found that the heat-releasing capability of the vapor chamber 100 is improved by virtue of the plurality of lines 120a.

Furthermore, when the plurality of first lines 120b are formed at the outer surface of the second plate 120, as described with reference to FIG. 13, the maximum temperature of the heating element 51 may be 83.0° C., and the maximum temperature of the neighboring element 52 may be 65.2° C. Therefore, it can be found that the heat-releasing capability of the vapor chamber 100 is further improved by virtue of the plurality of first lines 120b, which are formed at the direction in which heat flows convectively.

In addition, when both the plurality of first lines 120b and the plurality of second lines 120c are formed at the outer surface of the second plate 120, as described with reference to FIG. 14, the maximum temperature of the heating element 51 may be 82.5° C., and the maximum temperature of the neighboring element 52 may be 64.4° C. Therefore, it can be found that the heat-releasing capability of the vapor chamber 100 is greatly improved by virtue of the plurality of lines, which are disposed so as to intersect each other and thus to greatly increase the surface area of the second plate 120.

Figure 17:
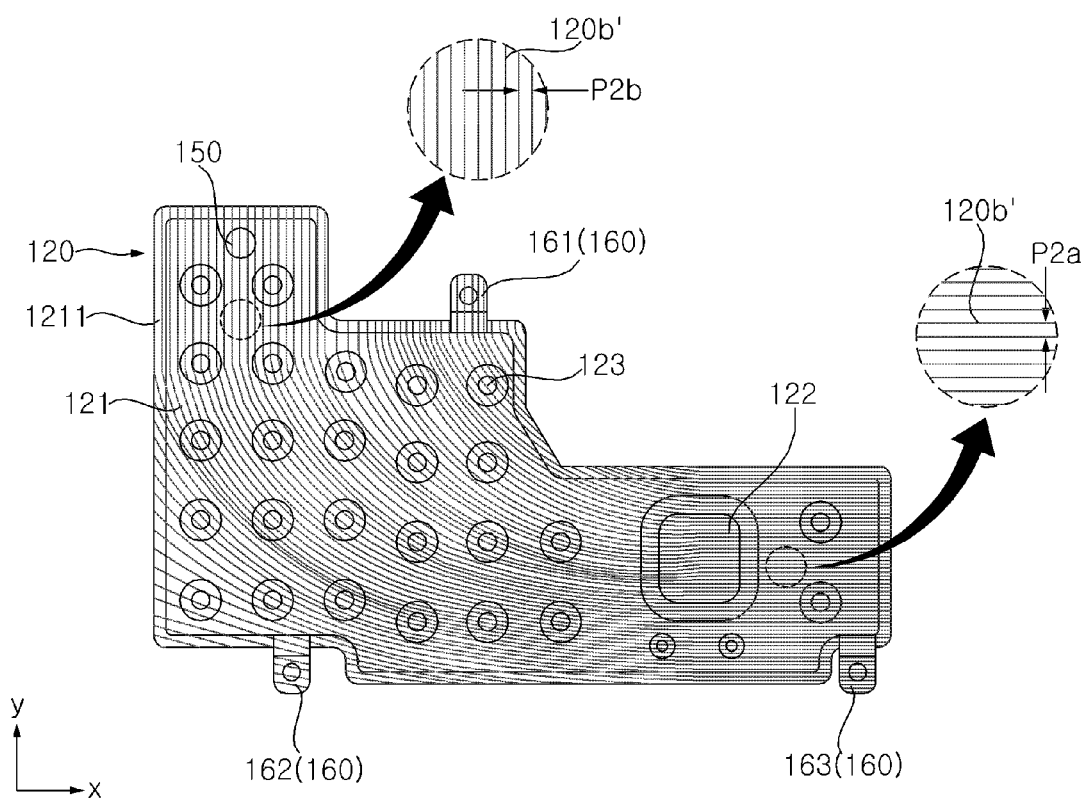

Referring to FIG. 17, a plurality of first lines 120b' may be formed at the outer surface of the second plate 120. The plurality of first lines 120b' may be formed at the same fashion as the plurality of first lines 120b, which has been described with reference to FIG. 13. However, the distance between the plurality of first lines 120b' may be greater in the area of the outer surface of the second plate 120 near the center A2 of the heat-absorbing part 113 than in the area of the outer surface of the second plate 120 near the center A1 of the heat-absorbing part 112.

For example, the distance between the plurality of first lines 120b' may have the minimum distance P2a in an area of the outer surface of the second plate 120 near the center A1 of the heat-absorbing part 112, and may have the maximum distance P2b in an area of the outer surface of the second plate 120 near the center A2 of the heat-releasing part 113. For example, the distance between the plurality of first lines 120b' may increase to the maximum distance P2b from the minimum distance P2a.

Consequently, the heat-releasing capability of the vapor chamber 100 may be further improved, compared to the case in which the plurality of first lines are arranged at a constant interval.

Figure 18:
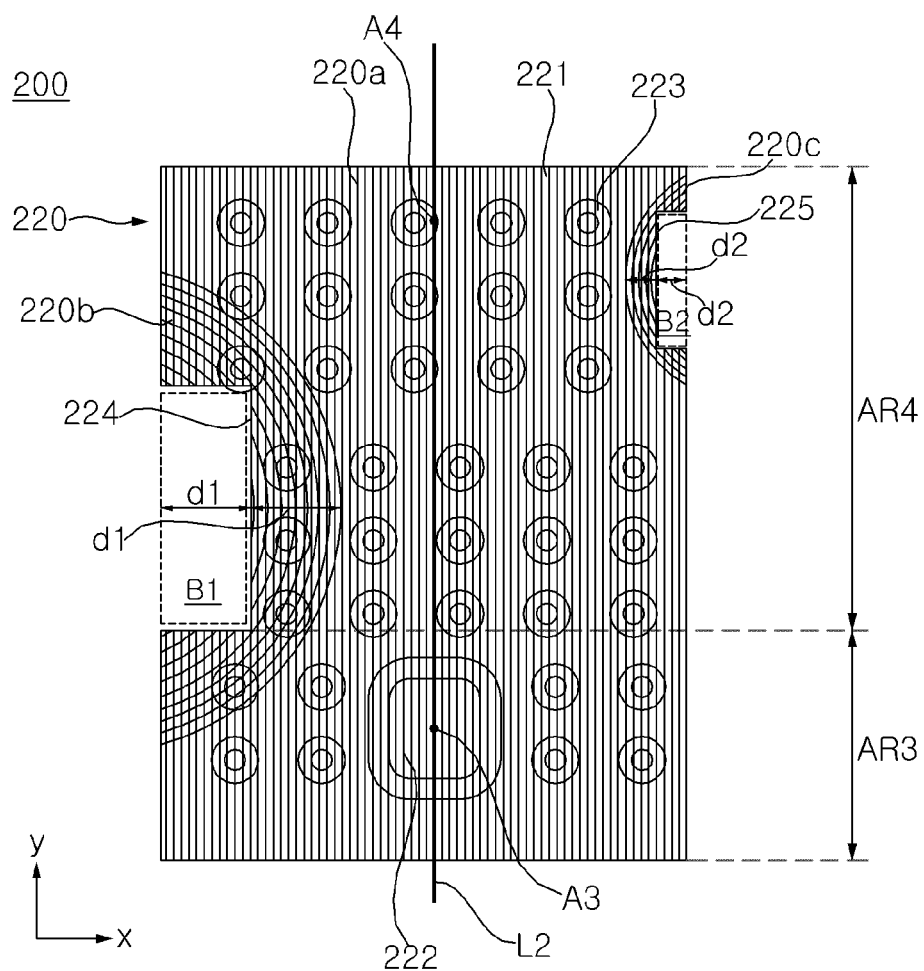

Referring to FIG. 18, a vapor chamber 200 may be configured to have a rectangular shape overall. In this case, the vapor chamber 200 may include a first plate 210 and a second plate 220, which are configured to have the same shape. The first plate 210 may define the rear surface of the vapor chamber 200, and may have the heat-absorbing part, which is in contact with the heating element 51. The second plate 220 may define the front surface of the vapor chamber 200, and may be coupled to the first plate 210. Here, the fluid may convectively flow in the internal space S' defined between the first plate 210 and the second plate 220.

For example, the vapor chamber 200 may include a first area AR3, in which the fluid is intensively evaporated, and a second area AR4, in which the fluid is intensively condensed. The second area AR4 may be positioned above the first area AR3. The heat-absorbing part, which is in contact with the heating element 51 and in which the fluid is most intensively evaporated, may be included in the first area AR1. Meanwhile, the heat-releasing part 113, which is positioned near the upper end of the vapor chamber 110 and in which the fluid is most intensively condensed, may be included in the second area AR2. For example, the heat-releasing part may be formed at the center of the upper portion of the vapor chamber 200.

The plurality of lines may be formed at the outer surface of the first plate 210 and/or the outer surface of the second plate 220. Each of the plurality of lines may be formed at the outer surface of the first plate 210 and/or the outer surface of the second plate 220 so as to have the shape of a very narrow groove. For example, the plurality of lines may be formed at the outer surface of the first plate 210 and/or the outer surface of the second plate 220 through a laser cutting process. For brevity of explanation, a description will be given based on the case in which the plurality of lines are formed at the outer surface of the second plate 220.

Consequently, since the surface area of the second plate 220 is increased, the heat energy of the fluid may be easily transmitted to the air that flows convectively outside the second plate 220. As a result, the evaporated fluid may be efficiently condensed, and thus the heat-releasing capability of the vapor chamber 200 may be improved. It goes without saying that the heat energy of the fluid may also be transmitted to the air that flows convectively outside the first plate 210.

The heat-absorbing part of the first plate 210 may face the recess 222 in the second plate 220, and the center A3 of the heat-absorbing part and the center of the recess 222 may be positioned on a line that extends in an anteroposterior direction. For example, the center A4 of the heat-releasing part may be positioned at the center of the upper portion of the vapor chamber 200.

The center A4 of the heat-releasing part may be positioned above the center A3 of the heat-absorbing part. An imaginary line L2, which connects the center A3 of the heat-absorbing part to the center A4 of the heat-releasing part may extend vertically. Here, the fluid may be evaporated in the internal space S', and may flow upwards. In other words, the overall direction in which the evaporated fluid flows may not greatly deviate from the direction, in which the imaginary line L2 extends.

Here, the plurality of lines may extend in a direction defined with reference to the imaginary line L2. Specifically, the plurality of lines may extend in a direction parallel to the imaginary line L2, and may include a plurality of first lines 220a, which are spaced apart from each other. For example, the distance between the plurality of first lines 220a may range from 0.8 mm to 1.2 mm.

Accordingly, since the surface area of the second plate 220 is increased by virtue of the plurality of first lines 220a, the heat energy of the fluid may be more easily transmitted to the air that flows convectively outside the second plate 220. As a result, the evaporated fluid may be more efficiently condensed, and thus the heat-releasing capability of the vapor chamber 200 may be further improved.

Furthermore, the plurality of lines may include a plurality of second lines (not shown), which intersect the plurality of first lines 220a and which are spaced apart from each other. In this case, since the surface area of the second plate 220 is further increased, the heat-releasing capability of the vapor chamber 200 may be further improved.

Recesses 224 and 225 may be formed toward the inside of the vapor chamber 200 from the side surface of the vapor chamber 200. For example, the recesses 224 and 225 may include a first recess 224 formed at the left side surface of the vapor chamber 200 and a second recess 225 formed at the left side surface of the vapor chamber 200. In this case, the first recess 224 may be depressed from the right side surface of the vapor chamber 200 in the leftward direction by a first distance d1 so as to prevent the vapor chamber 200 from interfering with an element that is mounted on the PCB P and is disposed in a first escape area B1. The second recess 22b may be depressed from the left side surface of the vapor chamber 200 in the rightward direction by a second distance d2 so as to prevent the vapor chamber 200 from interfering with an element that is mounted on the PCB P and is disposed in a second escape area B2.

Here, the plurality of lines may include first of third lines 220b, which extend in a direction parallel to a curved line, which is convex toward the inside of the vapor chamber 200, and which are spaced apart from each other. For example, the plurality of first of third lines 220b may be formed at an area that extends toward the inside of the vapor chamber 200 from the first recess 224 by a first distance d1.

Furthermore, the plurality of lines may include a plurality of second of third lines 220c, which extend in a direction parallel to a curved line, which is convex toward the inside of the vapor chamber 200, and which are spaced apart from each other. For example, the plurality of second of third lines 220c may be formed at an area that extends toward the inside of the vapor chamber 200 from the second recess 225 by a second distance d2.

Hence, the first of third lines 220b and/or the second of third lines 220c may be formed according to the shapes of the recesses 224 and 225. As a result, since the heat transfer between the fluid and air that flows convectively outside the vapor chamber 200, may be efficiently performed even in the areas near the recesses 224 and 225, it is possible to ensure heat-releasing capability of the vapor chamber 200 at a predetermined level or higher.

In accordance with an aspect of the present disclosure, provided is a display device including a display panel, a frame positioned behind the display panel, a PCB coupled to the frame and including a heating element, and a vapor chamber including an internal space for fluid to flow, wherein the vapor chamber includes a heat-absorbing part in contact with the heating element, a heat-releasing part positioned above the heat-absorbing part and spaced apart from the PCB, and a plurality of lines formed at an outer side of the vapor chamber, wherein the plurality of lines extend in a first direction corresponding to an axis that connects a center of the heat-absorbing part to a center of the heat-releasing part.

In accordance with another aspect of the present disclosure, the fluid may flow convectively in the internal space while being evaporated into a gaseous phase by heat transmitted from the heating element or condensed into a liquid phase.

In accordance with another aspect of the present disclosure, the vapor chamber may further include a first plate defining a rear side of the vapor chamber, wherein the first plate includes the heat-absorbing part, and a second plate defining a front side of the vapor chamber, wherein the second plate is coupled to the first plate, wherein the internal space may be defined between the first plate and the second plate, and wherein the plurality of lines may further be formed at an outer side of at least one of the first plate or the second plate.

In accordance with another aspect of the present disclosure, the axis may extend in a vertical direction, and the plurality of lines may include a plurality of first lines extending in a second direction parallel to the axis, wherein the plurality of first lines are spaced apart from each other.

In accordance with another aspect of the present disclosure, the plurality of lines may further include a plurality of second lines intersecting the plurality of first lines, wherein the plurality of second lines are spaced apart from each other.

In accordance with another aspect of the present disclosure, the vapor chamber may further include a recess depressed toward an inside of the vapor chamber from a side of the vapor chamber, and the plurality of lines may further include a plurality of third lines extending in a third direction parallel to a curved line convexly curved toward the inside of the vapor chamber with respect to the recess, wherein the plurality of third lines are spaced apart from each other.

In accordance with another aspect of the present disclosure, the axis may extend in a fourth direction intersecting a vertical direction, and the plurality of lines may include a plurality of first lines extending in a sloped direction that is angled with respect to the axis by a predetermined angle, wherein the plurality of lines are spaced apart from each other.

In accordance with another aspect of the present disclosure, the plurality of lines may further include a plurality of second lines intersecting the plurality of first lines, wherein the plurality of first lines are spaced apart from each other.

In accordance with another aspect of the present disclosure, the axis may extend in a fourth direction intersecting a vertical direction, and the plurality of lines may include a plurality of first lines extending in a direction parallel to a curved line convexly curved downwards in a direction defined with respect to the axis, wherein the plurality of first lines are spaced apart from each other.

In accordance with another aspect of the present disclosure, the plurality of first lines may be arranged on the outer side of the vapor chamber at regular intervals.

In accordance with another aspect of the present disclosure, a distance between each of the plurality of first lines may be greater in an area of the outer side of the vapor chamber near the heat-absorbing part than in an area of the outer side of the vapor chamber near the heat-releasing part.

In accordance with another aspect of the present disclosure, the distance between each of the plurality of first lines may gradually increase to a maximum distance from a minimum distance.

In accordance with another aspect of the present disclosure, each of the plurality of first lines may include a first section disposed near the heat-absorbing part and extending in a horizontal direction, a second section disposed near the heat-releasing part and extending in the vertical direction, and a third section disposed between the first section and the second section, wherein the third section is curved.

In accordance with another aspect of the present disclosure, the plurality of lines may further include a plurality of second lines intersecting the plurality of first lines, wherein the plurality of second lines are spaced apart from each other.

In accordance with another aspect of the present disclosure, the plurality of second lines may be formed at an area of the outer side of the vapor chamber near the heat-releasing part.

The effects of the display device according to the present disclosure will be described.

At least one embodiment of the present disclosure provides a display device including a vapor chamber, which has a relatively small volume and which is capable of efficiently releasing the heat from a heating element to the outside.

At least one embodiment of the present disclosure provides a display device in which a plurality of lines are formed at the outer surface of the vapor chamber in order to improve the heat-releasing capability of the vapor chamber.

At least one embodiment of the present disclosure provides a display device in which a plurality of lines are formed at the outer surface of the vapor chamber in the direction in which the fluid contained in the vapor chamber flows in order to further improve the heat-releasing capability of the vapor chamber.

At least one embodiment of the present disclosure provides various embodiments of the plurality of lines formed at the outer surface of the vapor chamber.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination of the configurations is not directly described, the combination is possible except in the case where it is described that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

What is claimed is:
1. A display device comprising:
a display panel;
a frame positioned behind the display panel;
a printed circuit board (PCB) coupled to the frame and comprising a heating element; and
a vapor chamber comprising an internal space for fluid to flow, wherein the vapor chamber comprises:
a heat-absorbing part in contact with the heating element;
a heat-releasing part positioned above the heat-absorbing part and spaced apart from the PCB; and
a plurality of lines formed at an outer side of the vapor chamber, wherein the plurality of lines extend in a first direction corresponding to an axis that connects a center of the heat-absorbing part to a center of the heat-releasing part.

2. The display device according to claim 1, wherein the fluid flows convectively in the internal space while being evaporated into a gaseous phase by heat transmitted from the heating element or condensed into a liquid phase.

3. The display device according to claim 1, wherein the vapor chamber further comprises:
   a first plate defining a rear side of the vapor chamber, wherein the first plate comprises the heat-absorbing part; and
   a second plate defining a front side of the vapor chamber, wherein the second plate is coupled to the first plate,
   wherein the internal space is defined between the first plate and the second plate, and
   wherein the plurality of lines are further formed at an outer side of at least one of the first plate or the second plate.

4. The display device according to claim 1, wherein the axis extends in a vertical direction, and
   wherein the plurality of lines comprise a plurality of first lines extending in a second direction parallel to the axis, wherein the plurality of first lines are spaced apart from each other.

5. The display device according to claim 4, wherein the plurality of lines further comprises a plurality of second lines intersecting the plurality of first lines, wherein the plurality of second lines are spaced apart from each other.

6. The display device according to claim 4, wherein the vapor chamber further comprises:
   a recess depressed toward an inside of the vapor chamber from a side of the vapor chamber, and
   wherein the plurality of lines further comprise a plurality of third lines extending in a third direction parallel to a curved line convexly curved toward the inside of the vapor chamber with respect to the recess, wherein the plurality of third lines are spaced apart from each other.

7. The display device according to claim 1, wherein the axis extends in a fourth direction intersecting a vertical direction, and
   wherein the plurality of lines comprises a plurality of first lines extending in a sloped direction that is angled with respect to the axis by a predetermined angle, wherein the plurality of lines are spaced apart from each other.

8. The display device according to claim 7, wherein the plurality of lines further comprises a plurality of second lines intersecting the plurality of first lines, wherein the plurality of first lines are spaced apart from each other.

9. The display device according to claim 1, wherein the axis extends in a fourth direction intersecting a vertical direction, and
   wherein the plurality of lines comprises a plurality of first lines extending in a direction parallel to a curved line convexly curved downwards with respect to the axis, wherein the plurality of first lines are spaced apart from each other.

10. The display device according to claim 9, wherein the plurality of first lines are arranged on the outer side of the vapor chamber at regular intervals.

11. The display device according to claim 9, wherein a distance between each of the plurality of first lines is greater in an area of the outer side of the vapor chamber near the heat-absorbing part than in an area of the outer side of the vapor chamber near the heat-releasing part.

12. The display device according to claim 11, wherein the distance between each of the plurality of first lines gradually increases to a maximum distance from a minimum distance.

13. The display device according to claim 9, wherein each of the plurality of first lines comprises:
   a first section disposed near the heat-absorbing part and extending in a horizontal direction;
   a second section disposed near the heat-releasing part and extending in the vertical direction; and
   a third section disposed between the first section and the second section, wherein the third section is curved.

14. The display device according to claim 9, wherein the plurality of lines further comprises a plurality of second lines intersecting the plurality of first lines, wherein the plurality of second lines are spaced apart from each other.

15. The display device according to claim 14, wherein the plurality of second lines are formed at an area of the outer side of the vapor chamber near the heat-releasing part.

* * * * *